United States Patent [19]

Schweitzer

[11] 4,142,684

[45] Mar. 6, 1979

[54] PULSE GENERATOR FOR INTERMITTENTLY ENERGIZING AN ACTUATING COIL OF A SPRAY NOZZLE OR THE LIKE

[75] Inventor: Karl Schweitzer, Oberlangkampfen, Austria

[73] Assignee: Maschinenfabrik Peter Zimmer Aktiengesellschaft, Kufstein, Austria

[21] Appl. No.: 801,014

[22] Filed: May 26, 1977

[30] Foreign Application Priority Data

Jun. 15, 1976 [AT] Austria .................................. 4375/76

[51] Int. Cl.² .......................... B05B 1/30; H03K 1/00
[52] U.S. Cl. ..................................... 239/585; 307/255;
307/270; 307/296 R; 361/152
[58] Field of Search ............... 307/270, 255, 293, 294,
307/311, 254; 361/194, 152, 195, 154, 196;
239/585

[56] References Cited

U.S. PATENT DOCUMENTS

| | | | |
|---|---|---|---|
| 3,143,668 | 2/1964 | Bloodworth et al. | 307/242 |
| 3,546,487 | 12/1970 | Espinal | 307/254 |
| 3,766,432 | 10/1973 | Markowitz et al. | 307/270 |

Primary Examiner—Stanley D. Miller, Jr.
Assistant Examiner—B. P. Davis
Attorney, Agent, or Firm—Montague & Ross

[57] ABSTRACT

A substrate to be patterned, such as a textile web, is moved past an array of nozzles with discharge orifices closely spaced from its surface, the substrate being firmly backed at locations confronting the nozzles by being drawn against a supporting conveyor or by being led around rollers. The nozzles are electromagnetically operated by needle valves, the valve needles being carried by membranes under substantially balanced pressures from the printing liquor and from a fluid such as compressed air. The electromagnetic coils are intermittantly energized by a programmed pulse generator with a large but brief driving current followed by a low holding current, the pulse generator including two complementary power transistors in series with a coil winding. A dyestuff applicator carrying one or more of such nozzles may be transversely displaceable across the substrate, under the control of a programmer, between intermittent advances of the substrate in its longitudinal direction.

20 Claims, 14 Drawing Figures

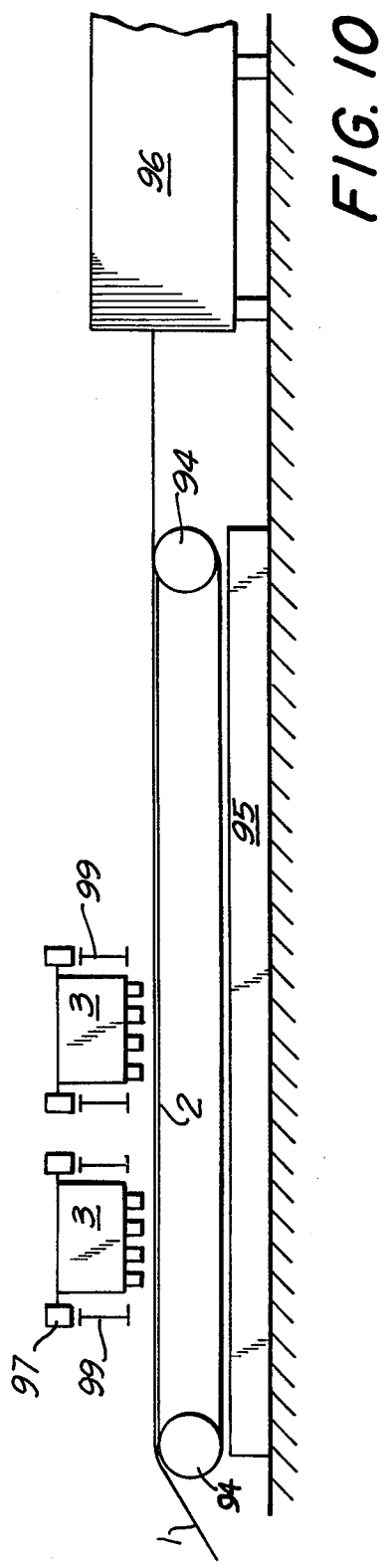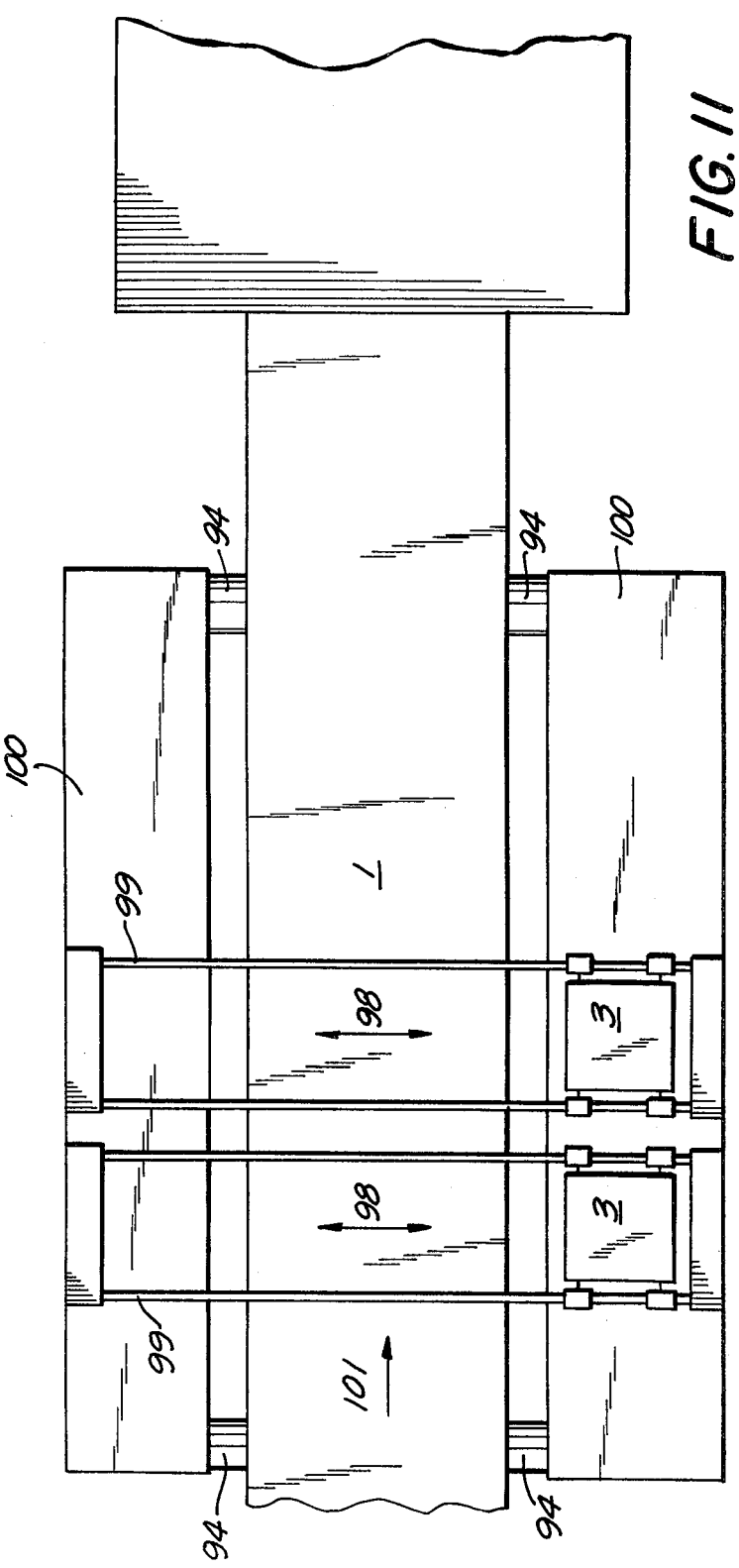

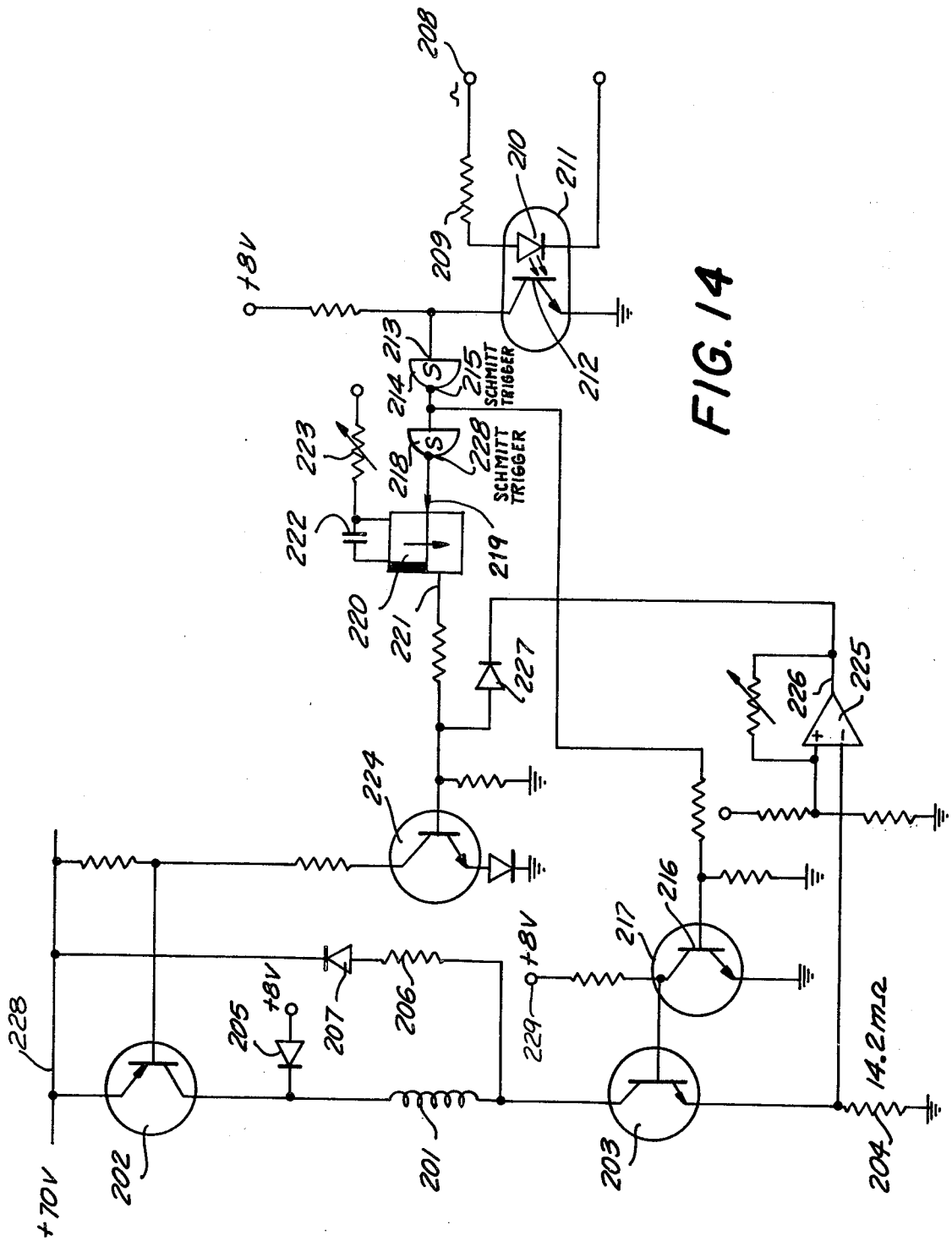

PULSE GENERATOR FOR INTERMITTENTLY ENERGIZING AN ACTUATING COIL OF A SPRAY NOZZLE OR THE LIKE

CROSS-REFERENCE TO RELATED APPLICATION

This application discloses subject matter described and claimed in two commonly owned and copending applications, i.e. Ser. No. 709,550 filed July 28, 1976 by Hans Kudlich and Ser. No. 729,803 filed Oct. 5, 1976 by me jointly with said Hans Kudlich and Walter Mayr.

FIELD OF THE INVENTION

My present invention relates to a pulse generator for the controlled energization of an inductive load, such as an actuating coil for the selective opening and closure of an electromagnetically operable discharge-control valve of a spray nozzle in an apparatus for applying patterns to a substrate as described in the two above-identified applications.

BACKGROUND OF THE INVENTION

When patterns are produced on a sheet or other substrate moving relatively to a highly directive nozzle from which a printing liquid is sprayed upon that sheet at close range, a precise timing of the spray is important for bringing out the fine details of the pattern. Control pulses conforming to the distribution of a particular color in the pattern can be readily generated with the aid of a suitable programmer, yet the mechanical and electrical inertia of the valve and its actuating coil tends to introduce distortions. Whereas the mechanical inertia can be minimized by improvements in valve design as disclosed in the application referred to, the electrical inertia due to the inductance of the actuating coil remains a separate problem.

OBJECT OF THE INVENTION

The object of my present invention, therefore, is to provide an improved pulse generator for the accurately timed energization of such actuating coils and other inductive loads.

SUMMARY OF THE INVENTION

I realize this object, in accordance with the present invention, by the provision of a first and a second power transistor connected across a main supply of direct current in series with each other and with a load inductance, these power transistors being normally cut off by respective biasing means. Upon the occurrence of a control pulse, the first power transistor is unblocked during a preferably brief first interval by first timing means connected to the first biasing means as well as to the source of control pulses. During a second, longer interval, also initiated by the occurrence of the control pulse, the second power transistor is unblocked by second timing means measuring the duration of that pulse, the second timing means being connected to the second biasing means as well as to the pulse source. With both power transistors conducting, the load inductance is energized with a large driving current to the end of the first interval; an ancillary direct-current supply of lower voltage than the main supply is then connected across the load inductance by way of the second power transistor for maintaining that inductance energized to the end of the second interval with a holding current of a magnitude substantially less than that of the driving current previously passed through it. According to a more particular feature of my invention, the first timing means comprises a monostable multivibrator or monoflop driven by a Schmitt trigger which is in cascade with another Schmitt trigger constituting the second timing means; the latter is connected to the source of control pulses, advantageously through a photoelectric coupler including a light-emitting diode and a phototransistor designed to suppress spurious transient which might otherwise result in an untimely actuation of the timing circuit.

Another advantageous feature of my invention resides in the provision of a rectifying connection returning residual energy from the load inductance to the main power supply upon the cut-off of the first power transistor.

BRIEF DESCRIPTION OF THE DRAWING

The above and other features of my invention will now be described in detail with reference to the accompanying drawing in which:

FIG. 10 is a diagrammatic side-elevational view of a machine similar to that shown in FIG. 1 but provided with additional features;

FIG. 11 is a top plan view of the machine shown in FIG. 10;

FIG. 14 is a diagram-pulse generator according to my invention controlling an electromagnetic ink applicator as shown in FIGS. 5–9.

SPECIFIC DESCRIPTION

Figure 1:
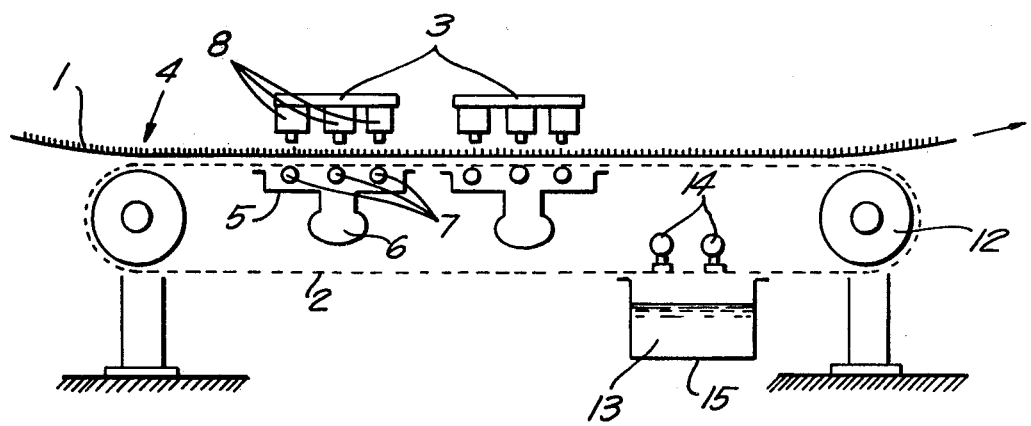
FIG. 1 is a longitudinal sectional view of a printing machine of the type described in the above-identified copending application.

FIG. 1 shows a substrate 1 which is transported by an endless conveyor 2 past several sets of dyestuff applicators 3. Conveyor 2, led around rollers 12, may consist of woven wire mesh or of a perforated sheet of polymeric material such as vulcanized rubber or plastic of limited longitudinal extensibility. The substrate 1, which may be a web of fabric continuously drawn from a nonillustrated supply roll, enters the machine at 4 and passes between the conveyor 2 and the applicators 3. Below the conveyor, in line with each set of applicators, there is provided a suction box 5 in which a partial vacuum is produced by a nonillustrated blower whose low-pressure side communicates with a duct 6. The magnitude of this vacuum may range between about 100 and 1000 mm of water column substantially equivalent to 0.01–0.1 atmosphere. This partial vacuum firmly holds the conveyor 2 together with the overlying substrate 1 onto supporting rollers 7, thereby maintaining a well-defined separation between the substrate and the applicator nozzles 8. This separation may range between several millimeters and a fraction of a millimeter; in an extreme case the nozzles could even touch the substrate. Advantageously, as illustrated, the nozzles 8 are precisely aligned with respective supporting rollers 7.

Figure 2:
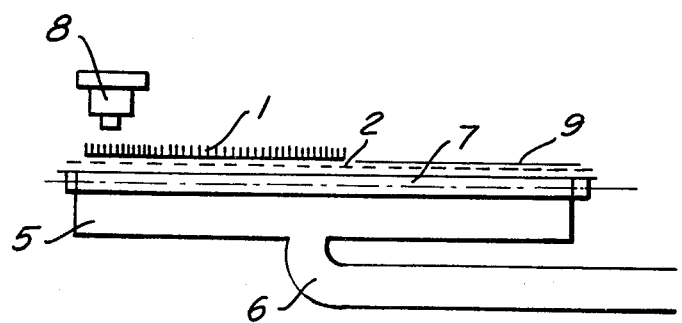
FIG. 2 is a cross-sectional view of part of the machine shown in FIG. 1.
Figure 3:
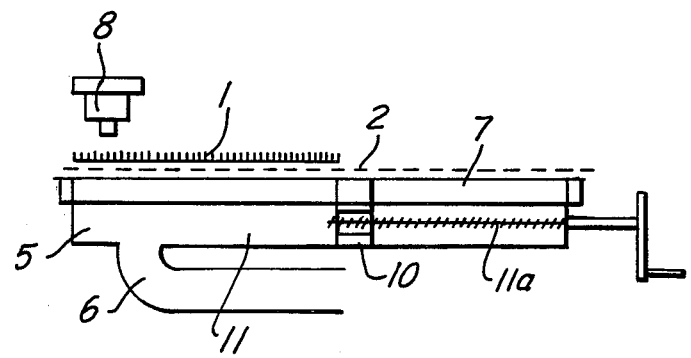
FIG. 3 is a view similar to FIG. 2, illustrating a modification.

In order to accommodate substrates of widely different widths, an air-impermeable cover 9 may be disposed on the suction box 5 alongside a narrower substrate as shown in FIG. 2. Alternatively, a lateral partition 10 transversely shiftable by a leadscrew 11a can be disposed in the suction box (see FIG. 3) to confine the vacuum to a space 11 directly below the substrate.

FIG. 1 further shows a washing station 13 traversed by the conveyor after it passes around the outlet-side roller 12, this station comprising a set of sprinklers 14 above the lower run of the conveyor and a trough 15 below it. The trough could also be provided with a nonillustrated suction device to expedite the drying of the conveyor.

The use of a partial vacuum to hold the substrate to its carrier in the region of the spray nozzles has the added advantage of promoting, in a manner known per se, the penetration of the dyestuff into the interstices of the substrate.

Figure 4:
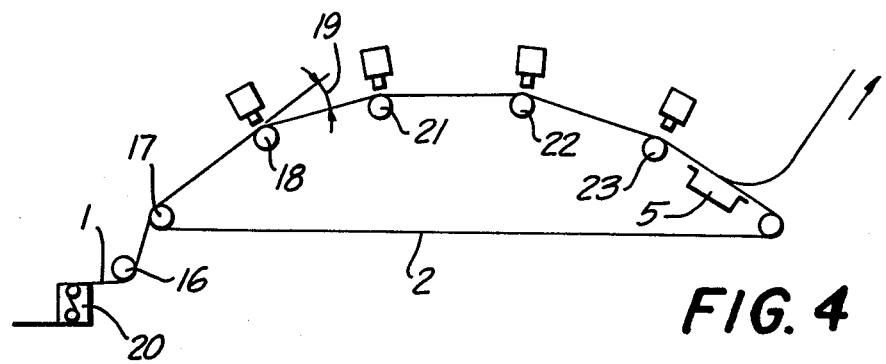
FIG. 4 is a diagrammatic elevational view of a somewhat different printing machine.

FIG. 4 shows a modified printing machine particularly designed for coarse fabrics or other wide-mesh substrates which would require a high degree of suction in order to be held firmly onto the conveyor or other support. In such a case it is advantageous to guide the substrate 1 along an upwardly convex path defined, downstream of an entrance roller 16, by a set of support rollers 17–23 aligned with respective nozzles. At each roller 18–23, the substrate is deflected downwardly by a small angle 19 and thus held under tension against that roller. This tension may be imparted to the substrate, upstream of the first deflecting roller 16, by a friction brake 20 and may be maintained downstream of the last roller 23 by a suction box 5 similar to those described above. Such a suction box could be omitted if the conveyor 2 is studded in a manner known per se and if the weight of the substrate is high enough to hold that substrate onto the conveyor with a sufficient pressure to prevent its shifting on the studded surface.

Figure 8:
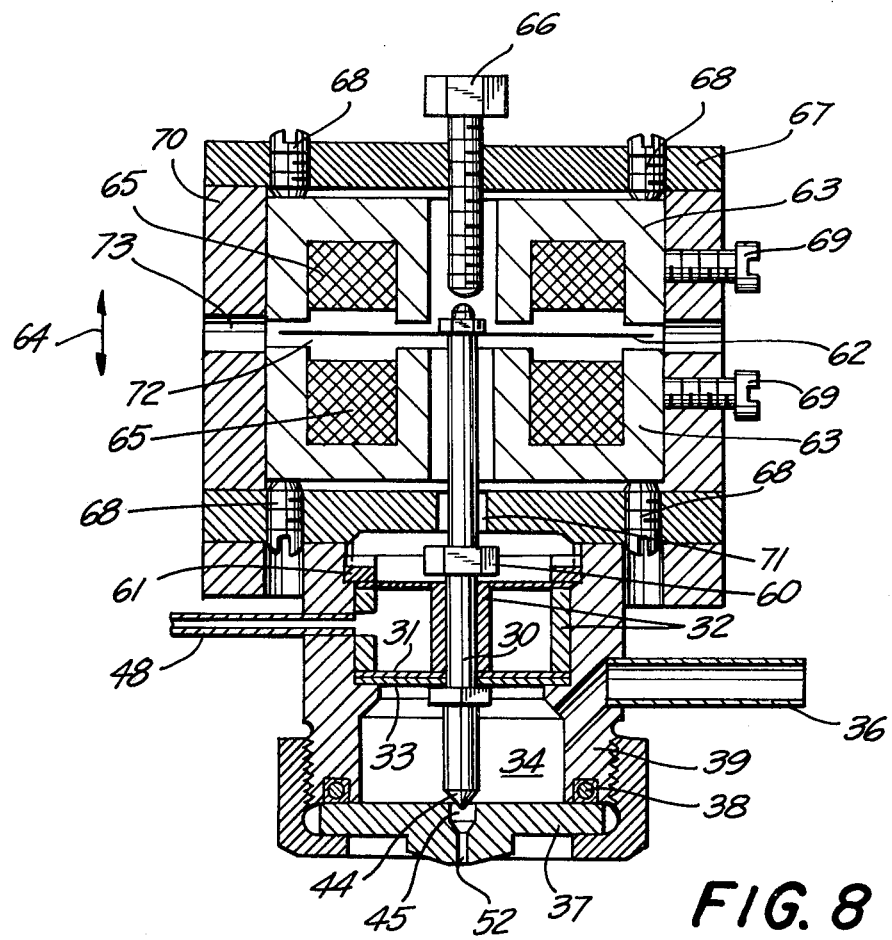
Figure 5:
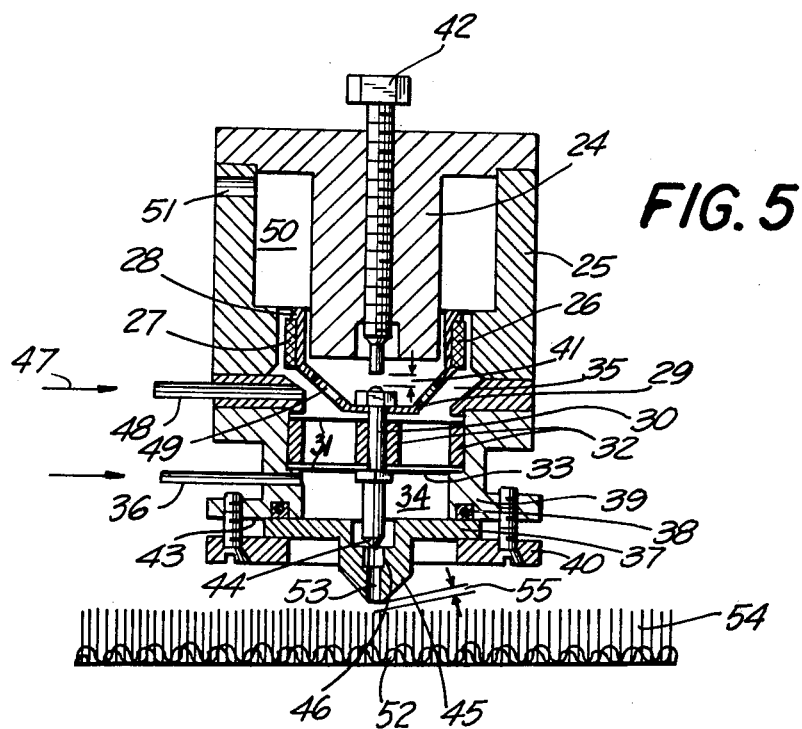
FIG. 5 is an axial sectional view, drawn to a larger scale, of an electromagnetic dyestuff applicator adapted to be used in a machine as shown in the preceding Figures.

FIG. 5 shows an advantageous dyestuff applicator particularly adapted for use with a pulse generator according to my invention. This applicator comprises a permanent magnet 24 forming a central core integral with a flange serving as a cover for an annular space 50 surrounding that core. The flange of magnet 24 rests on a ferromagnetic housing 25 forming a narrow annular gap 26 with the lower end of the core. An annular coil 27 coaxially surrounds that lower end and is vertically movable within the gap 26 while being held on a downwardly tapering carrier 28. This carrier, which has a very small wall thickness, may consist of light metal or of plastic material such as, for example, glass-fiber-reinforced polyester. In order to minimize eddy currents, the carrier should be slitted if made of metal; it is therefore preferable to use a resinous carrier, despite its lower thermal conductivity, since the absence of a slit enhances its mechanical stability. This stability is further improved by the frustoconical shape of the lower part of the carrier body terminating in a base 29 of small radius to which a depending control needle 30 is attached. Needle 30 is secured to a pair of vertical membranes 31 which are clamped in position, e.g. as shown in FIG. 8 described hereinafter, in order to be held centered on the vertical axis of the applicator. A high-strengh magnetic field (e.g. on the order of 15,000 gauss) may be easily maintained in the annular gap 26.

Figure 6:
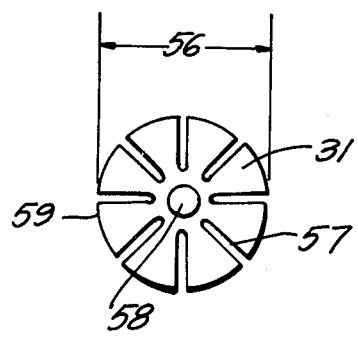
FIG. 6 is a plan view and FIG. 7 is a sectional top view showing details of the dyestuff applicator of FIG. 5.

As seen in FIG. 6, each membrane 31 is formed with a set of radial slots 57 designed to facilitate a deflection of its center 58 relatively to its clamped rim 59. This allows the needle 30 to be raised or lowered by several tenths of a millimeter with only a minimum force. The membranes advantageously consist of thin sheet metal whose thickness should not exceed 1% of their diameter 56.

Figure 7:
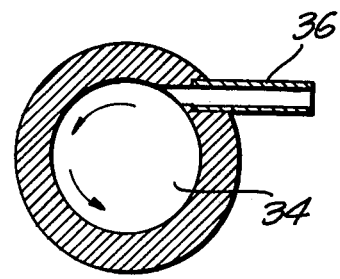

Annular space 50 is vented to the atmosphere at a port 51 and communicates, via gap 26, with a space 35 surrounding the coil carrier 28. Space 35 extends into the region between the membranes 31, owing to the presence of the radial slots 57. A diaphragm 33 of rubber or plastic material separates this space in a fluidtight manner from a dyestuff chamber 34 which opens into a bore 46 of a nozzle 45 integral with a bottom plate 37 closing the chamber 34 from below. Plate 37 lies flat against the underside 43 of a peripheral wall 39 of chamber 34 onto which it is clamped by screws engaging a retaining ring 40; a packing ring 38 in a groove of surface 43 shields the chamber 34 against the atmosphere. Dyestuff can be admitted into chamber 34 via an inlet 36 which, as best seen in FIG. 7, opens tangentially into the chamber to facilitate a cleaning thereof by a rinsing fluid circulating in the direction of the arrows. With a radially extending inlet there would be a tendency to form pockets in which the cleansing action of the rinsing fluid would be greatly diminished.

Needle 30 terminates in a cone 44 which adjustably constricts the bore 46 leading to the orifice 53 of nozzle 45. The outlet end 52 of this orifice is separated from a nap 54 of the substrate by a small distance 55 of, say, 0.5 to 2 mm. The dyestuff in chamber 34 is preferably discharged from orifice 53 at a velocity of at least 10 meters per second; this speed and the small distance 55 insure a penetration of the nap 54 even by a relatively viscous dyestuff with sharp tracing of the strokes of the pattern to be formed thereon. In order to maintain the injection pressure of the dyestuff within chamber 34, a back-up pressure is created in space 35 by the admission of a stream of compressed air 47 into that space through an inlet 48. The two pressures should be about equal but a small difference therebetween may be utilized to accelerate the electromagnetic displacement of needle 30 in a downward or an upward direction to increase or reduce its throttling effect upon the outflow of dyestuff. The compressed air leaves the space 35 by way of vent 51 and, in passing through the gap 26, helps cool the electromagnetic coil 27 which is energized over nonillustrated leads by a circuit described hereinafter with reference to FIG. 14. Coil carrier 28 has apertures 49 designed to equalize the pressure inside and outside its body, these apertures also enabling part of the cooling airstream to circulate along the inner coil surface. Port 51, which may be one of several outlets, may be provided with conventional throttling devices such as screws or valves designed to adjust the air pressure within the applicator and to slow the escape of the admitted air. The stroke 41 of needle 30 is adjustable by a setscrew 42. The shape of the spray leaving the nozzle 45 is determined by the ratio of the length of orifice 53 to its diameter.

FIG. 8 shows a modified applicator whose lower portion, including dyestuff chamber 34 and nozzle plate 37, is practically the same as in FIG. 5. Membranes 31 and 33 are held in position by concentric annular spacers 32, also shown in FIG. 5, with the aid of a hexagonal nut 60 on a threaded upper extremity of needle 30 and a surrounding notched nut 61 with external threads screwed into a recess of peripheral wall 38. The upper end of needle 30, traversing a bore 71 in a plate forming the bottom of a chamber 72, is secured to a ferromagnetic foil 62 preferably of the laminated type. Foil 62 constitutes the armature of a pair of confronting electromagnets with toroidal cores 63 and coils 65, the cores being separated by a narrow axial air gap within which the foil 62 can oscillate vertically as indicated by an arrow 64. These cores advantageously consist of ferrites minimizing the flow of eddy currents and the losses of energy resulting therefrom. The coils 65 of copper wire can be alternately energized to raise or to lower the needle 30. The stroke of the needle is limited by a setscrew 66 threaded into a cover plate 67 which rests on a peripheral wall 70 and carries grub screws 68 which, together with similar screws in the associated bottom plate, serve for a precise adjustment of the position of the cores. This position can be fixed with the aid of setscrews 69. The high-pressure air entering the space 72 via inlet 48 and gap 71 escapes through ports 73 which could again be provided with nonillustrated throttling devices.

The construction of FIG. 8 has the advantage, compared with that of FIG. 5, that large magnetic forces can be developed with a small armature mass and that the coil assembly 65 is stationary so as to be energizable by fixed leads which are not damaged by the high-speed needle movements. Moreover, the coils can be made as large as necessary to dissipate the developing heat.

On the other hand, the machine of FIG. 5 has the advantage that the ratio of applied force to movable mass can be made as large as desired through the use of sufficient energizing currents for the coil 27. This requires, of course, that sufficient heat can be dissipated by the structure. Thus, one or the other type of applicator may be preferred under given circumstances. In either case the electromagnetic winding should be energized with short rectangular pulses, e.g. of a duration of several tenths or hundredths of a second, followed by a constant current of a magnitude reduced by about a factor of 10. This mode of energization enables high accelerations with the applicator of FIG. 5 whose nozzle can thus be used for the tracing of fine details, albeit with relatively large intervals between pulses during which only the constant holding current flows through the coil 27. Since the construction of FIG. 8 provides better cooling but acceleration is limited by the saturation of the foil 62, this applicator cannot respond so quickly but its nozzle can be opened and closed more frequently within a given time interval. In principle the construction of FIG. 8 is intended for a periodic opening and closure at a rate of about 2000 to 3000 reciprocations per second. Such an operation facilitates particularly the printing of half-tones which is very difficult to achieve with conventional printers of the rotary-screen type. In the case of a printing screen, different color shades are produced by the use of larger or smaller screen apertures; this technique, however, inherently falsifies the relative values of the color shades so that true half-tones cannot be obtained. On the other hand, a quick-acting nozzle according to the invention enables the nozzle orifice to be held open for longer or shorter periods at a frequency which can be held constant or varied at will, in conformity with the desired shade, so that precisely measured quantities of dyestuff can be sprayed onto a unit area of the substrate.

Figure 9:
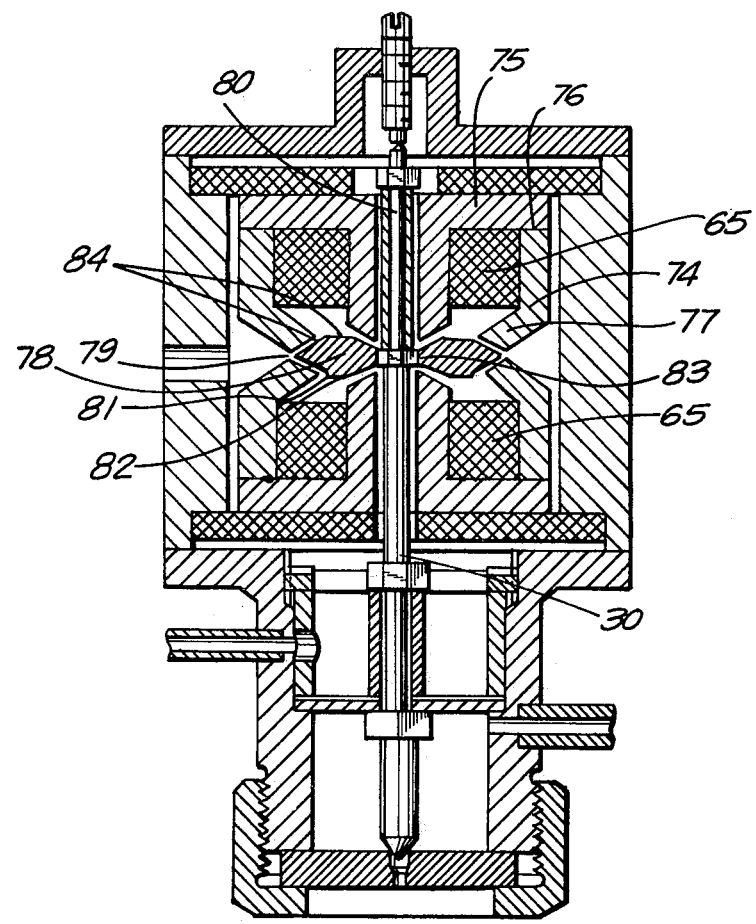
FIGS. 8 and 9 are views similar to FIG. 5, showing modifications of the dyestuff applicator.

FIG. 9 shows another applicator which is generally similar to that of FIG. 8 but wherein the coils 65 are encased in differently shaped holders 74, 75 of ferromagnetic material. The inner holder portion 75 forms a flanged core, similar to that shown at 24 in FIG. 5, surrounded by the coil 65 and bonded at 76 to the outer annular holder portion 74. An insulating layer, e.g. of paper, may be inserted at the joint 76 to prevent the flow of eddy currents. At 77 the holder portion 74 converges frustoconically toward an armature 78 replacing the foil 62 of FIG. 8.

The energization of coils 27, 65 with short high-current pulses at a frequency depending on the desired printing density, alternating with a small holding current is carried out by a programmed pulse generator according to my present invention as described hereinafter with reference to FIG. 14.

Armature 78 has an outer peripheral ridge 79 and spreads vertically toward the axis 80. Thus, the annular cross-section of the armature along a cylinder surface centered on that axis increases sharply up to a point 81 and then remains constant to a point 82 whereupon it decreases with shorter radii. A small disk 83 of constant thickness forms the center of the armature and serves to secure it to the needle 30.

This shape is designed to produce large forces with small movable masses. The effective cross-section of armature 79 perpendicular to the flux, i.e. along cylinders of different radii centered on axis 80, is so chosen that the degree of saturation is substantially uniform throughout the armature body. These cross-sections are preferably only about half as large as those which the flux traverses in the coil holders 74, 75. Air gaps 84 between the armature 78 and the coil holders 74, 75 are just wide enough to permit a needle stroke of a few tenths of a millimeter. The coils 65 should be so dimensioned that the armature 78 can reach its saturation without excessive heat development in these coils. A further advantage of this armature configuration is the fact that its mass is concentrated closer to its axis (as compared with a disk-shaped body of constant height such as foil 62) so that its natural frequency shifts to higher values.

Figure 12:
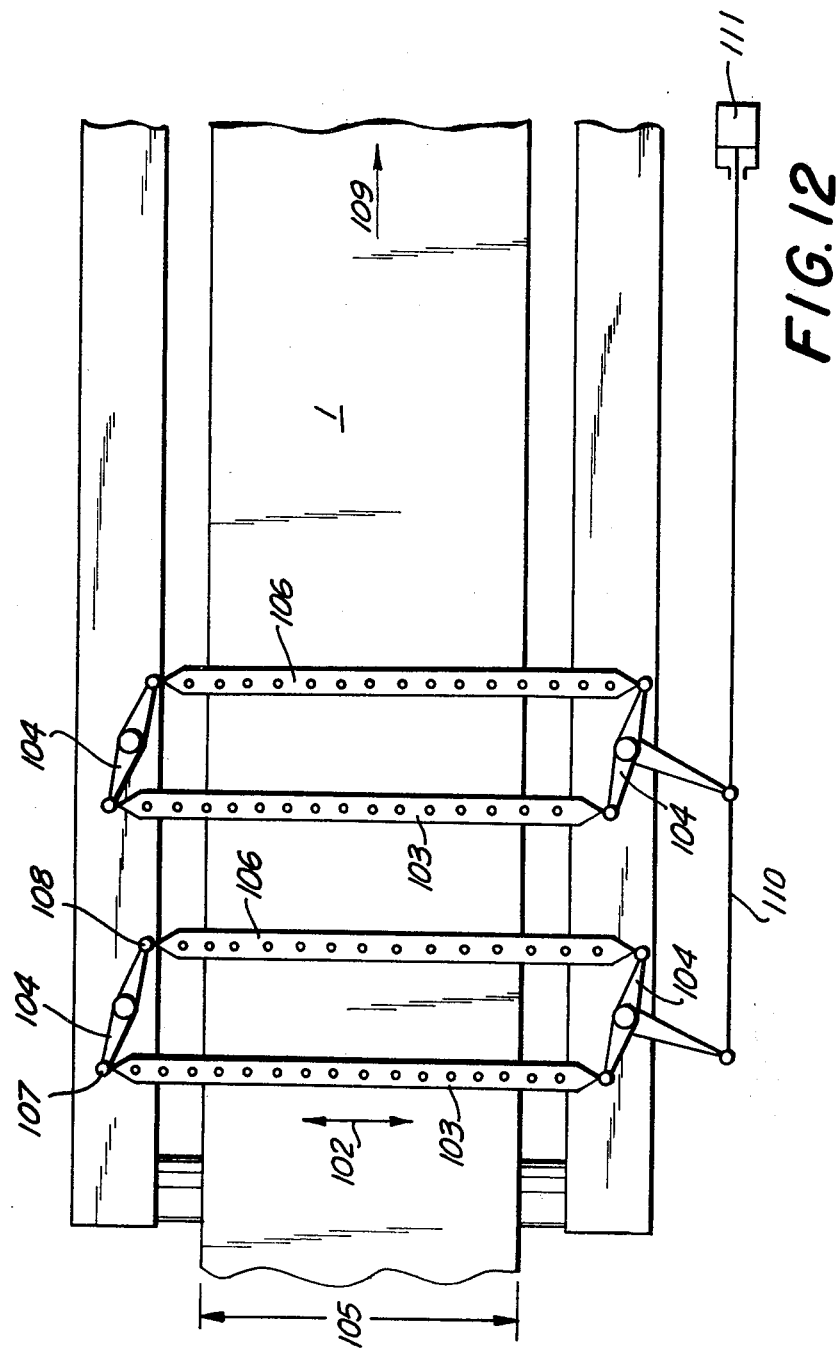
FIG. 12 is a view similar to FIG. 11, illustrating a modification.

In order to imprint substrates with jets trained upon them, as described hereinabove, a nozzle carrier can be mounted fixedly above the substrate which can be moved underneath the nozzles. With a pattern whose design consists of many fine lines, a large number of such stationary nozzles are required so that the system becomes bulky and expensive to manufacture and operate. It is therefore advantageous to use nozzles, especially those of the fast-acting type described above, which are themselves movable so that a single nozzle can apply dyestuff to a substrate zone of considerable width. Such an arrangement greatly reduces the number of nozzles required and also simplifies the associated equipment including pattern readers coacting with a matrix, preamplifiers and power amplifiers designed to convert sensing commands into control pulses for the nozzles. FIGS. 10–12 show such an arrangement designed to produce intricate patterns by relatively simple means.

According to FIG. 10 the substrate 1 is again advanced, as in FIG. 1, on an endless conveyor 2 (or possibly on a stationary support table) past several sets of dyestuff applicators 3 operating in the above-discussed manner. Conveyor 2 is shown led around rollers 94 mounted on a base 95. The imprinted substrate is received in a drying chamber 96.

Suction boxes 5, as shown in FIG. 1, can again be disposed beneath the upper run of the perforated conveyor.

As shown in FIGS. 10 and 11, rails 99 rigid with base 95 extend transversely across the substrate 1 and are engaged by rollers 97 from whose shafts the applicators 3 are suspended. The nozzle arrays can thus be disposed, as indicated by arrows 98, in a direction perpendicular to the direction of travel 101 of the substrate. The rails extend on each side of the substrate beyond the conveyor 2 so as to overhang lateral receptacles 100 designed to receive residual dyestuff in the event of a color change or rinse water after completion of a printing operation.

The shifting of the nozzles in the direction of arrows 98 is accompanied by a modulation of their jets according to a predetermined program. Upon completion of a traverse, the substrate 1 is advanced in the direction 101 by a predetermined increment of movement which can be selected according to the layout of the nozzles and to the desired complexity of the pattern. The applicators 3 can then be returned to their starting point and, in the course of this reverse stroke, again irrigate the substrate 1 with dyestuff. The programmer and the associated control circuits for the opening and closure of the nozzles have not been illustrated. Printing speeds comparable to those of conventional carpet-printing machines, in a range of 3 to 10 meters per minute, can be realized in this manner with the aid of considerably less expensive equipment.

According to FIG. 12, the substrate 1 is spanned by nozzle bars 103, 106 which are articulated to cross-levers 104 to form parallelogramatic linkages therewith. Each bar 106 may, of course, carry more than a single row of nozzles. A piston rod 110 of a hydraulic servomotor 111 controls these linkages so as to make their nozzle bars move alternately in opposite directions, as indicated by an arrow 102, again transversely to the direction of motion of the substrate represented by an arrow 109. The stroke of the joints 107 and 108, and therefore that of each individual nozzle, is only a small fraction of the width 105 of the substrate, amounting for example to 2.5 centimeters while the width 105 may be on the order of meters. The intermittent advance of the substrate is again timed to occur at the end of any stroke.

Figure 13:
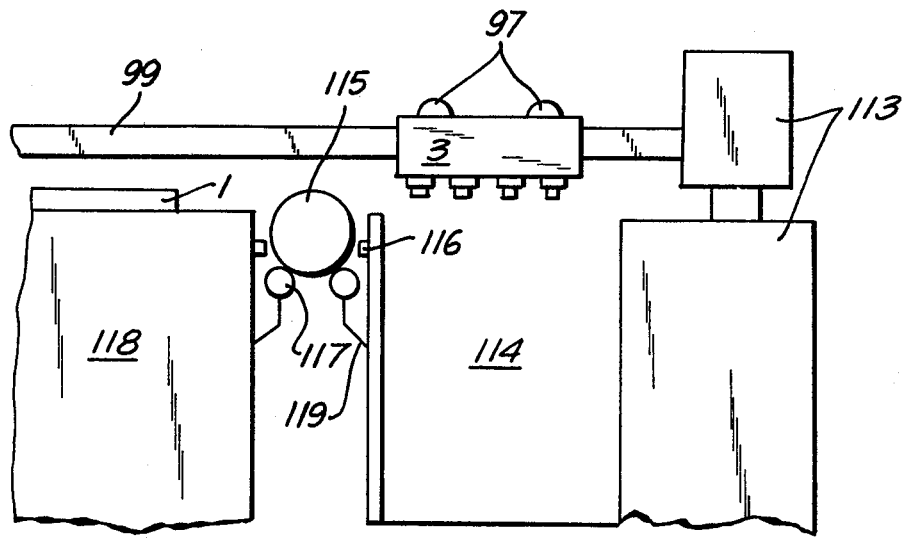
FIG. 13 is a fragmentary, diagrammatic cross-sectional view of a printing machine of the general type shown in preceding Figures, illustrating another detail.

FIG. 13 shows an arrangement for cleaning the nozzles of an applicator 3 in a machine which is generally similar to that shown in FIGS. 10 and 11, except that the conveyor 2 has been replaced by a support table 118. At one or both sides of this table there is provided a cylinder 115 whose surface may be covered by an absorbing foam layer and which contacts the nozzles whenever the applicator 3 moves across it on rails 99. These rails are provided with end mountings 113 separated from the table 118 by a channel 114 which provides easy access to the nozzles for purposes of inspection, replacement or minor repairs. Residual dyestuff and other matter removed from the nozzles by the cylinder 115 are taken off by stripper rolls 117 which are pressed onto the underside of that cylinder with the aid of movable arms 119. Sprinklers 116 flanking the cylinder 115 can be actuated automatically in certain inoperative positions of the applicator block 3, to irrigate the cylinder surface while the stripper rolls are simultaneously moved upwardly into contact with the cylinder.

FIG. 14 shows a circuit arrangement for the rapid energization of the electromagnetic coils in the applicators of FIGS. 5–9 in conformity with my present invention. These coils are represented in FIG. 14 by an inductance 201 inserted between a PNP power transistor 202 and an NPN power transistor 203. Transistor 202, when conducting, briefly connects the coil 201 to positive potential of, say, +70V on a lead 228 energized from a high-voltage terminal of a main supply of direct current whose other terminal is grounded; simultaneously, of course, the other power transistor 203 must also conduct in order to complete a circuit to ground by way of a low-ohmic resistor 204.

Transistor 202 conducts only for a short period determined by a first timing means including a monoflop 220, e.g. of 0.5 ms, causing a steep rise of the current in coil 201. Upon the cutoff of this transistor the coil is energized via a diode 205 with a voltage of +8V from a terminal 229 of an ancillary direct-current supply. This voltage suffices to maintain a holding current in the coil 201 as long as the transistor 203 conducts. Upon the cutoff of this transistor it is desirable that the coil 201 be de-energized as quickly as possible. For this purpose the end of the coil tied to the collector of transistor 203 is connected by way of a resistor 206 and a diode 207 to positive potential. In this way the energy stored in the coil is returned to the supply rather than being wastefully converted into heat.

The two power transistors 202 and 203 operate as follows:

A terminal 208 receives a rectangular control pulse measuring the period during which the coil 201 is to be energized. This pulse, passing through a resistor 209, energizes a light-emitting diode 210 of a photoelectric coupler 211. A light-responsive transistor 212 in coupler 211 thereupon substantially grounds an input 213 of a Schmitt trigger 214, serving as a second timing means, for the duration of that control pulse. During this interval the output 215 of Schmitt trigger 214 carries a signal fed on the one hand to the base 216 of an NPN pilot transistor 217 in a biasing circuit for power transistor 202 and on the other hand to a second Schmitt trigger 228 in cascade with Schmitt trigger 214. Pilot transistor 217, which is normally conductive, is blocked by this signal and drives the base of power transistor 203 positive, causing it to conduct. The second Schmitt trigger 218, forming part of the first timing means, has an inverting output 228 which at this point carries a voltage tripping the monoflop 220 whose off-period is determined by a shunt capacitor 222 and a trimming resistor 223. The output 221 of the monoflop is a brief positive spike unblocking another pilot transistor 224 in a biasing circuit for power transistor 202; the latter transistor then conducts, thereby completing the energizing circuit for coil 201. At the end of the spike the transistor 202 is again cut off, coil 201 thereupon again receiving the low voltage of +8V through diode 205.

In order to prevent possible multiple responses of monoflop 220 and resulting malfunction of the switching circuit, a current-limiting network is provided. It the monoflop conducts beyond its normal time, the current in coil 201 rises toward objectionable values. Resistor 204, which may have a magnitude of 14.2 milohms, measures this current flow and cuts off the power transistor 202 if the latter conducts too long. Thus, a rise in the emitter potential of transistor 203 above a predetermined threshold trips an operational amplifier 225 whose output 226 is thereupon grounded, thereby lowering the base potential of pilot transistor 224 via a diode 227 to substantially ground potential so that transistor 202 is blocked.

The discharges from the nozzles need not be trained onto flat substrates but can be used to form patterns on bodies, hollow or otherwise of any shape. This is possible because the surface of the article to be patterned need not be in contact with a printing screen or with a nozzle. The described technique is also particularly useful for the imprinting of substrates, such as plastic sheets, which are especially sensitive to contact and on which successive imprinting by several screen stages would mar the color patterns already applied thereto. The nozzles need not operate with liquid dyestuffs but could also be used for applying gaseous fluids or finely comminuted solids in a gaseous carrier to the surface of a substrate.

I claim:

1. a pulse generator for the controlled energization of an inductive load, comprising:
   a main supply of direct current;
   a first and a second power transistor connected across said main supply in series with each other and with a load inductance;
   a source of control pulses;
   first and second biasing means normally cutting off said first and second power transistors, respectively;
   first timing means connected to said source via a photoelectric coupler and further connected to said first biasing means for unblocking said first power transistor during a first interval upon the occurrence of a control pulse;
   second timing means connected to said source via said photoelectric coupler and further connected to said second biasing means for unblocking said second power transistor during a second interval longer than said first interval upon the occurrence of a control pulse, thereby energizing said load inductance to the end of said first interval with a large driving current from said main supply by way of said first and second power transistors; and
   an ancillary direct-current supply of lower voltage than said main supply connected across said load inductance by way of said second power transistor for maintaining said load inductance energized to the end of said second interval with a holding current of a magnitude substantially less than that of said driving current.

2. A pulse generator as defined in claim 1 wherein said first and second power transistors are of opposite conductivity types and are provided with respective collectors connected to opposite ends of said load inductance.

3. A pulse generator as defined in claim 2 wherein said ancillary supply comprises a low-voltage terminal connected to the collector of said first power transistor by way of a diode.

4. A pule generator as defined in claim 3 wherein said first power transistor has an emitter connected to a high-voltage terminal of said main supply, further comprising a rectifying connection between the collector of said second power transistor and said high-voltage terminal for returning residual energy from said load inductance to said main power supply upon cut-off of said second power transistor.

5. A pulse generator as defined in claim 1, further comprising a protective circuit for cutting off said first power transistor upon overlong conduction thereof due to a malfunction of said first timing means, said protective circuit including a low-ohmic resistor in series with said second power transistor and said load inductance.

6. A pulse generator as defined in claim 1 wherein said first and second timing means comprise a pair of cascaded Schmitt triggers.

7. A pulse generator as defined in claim 6 wherein said first timing means further comprises a monoflop with adjustable time constant connected to the second one of the cascaded Schmitt triggers.

8. A pulse generator as defined in claim 7 wherein said first and second biasing means include a first and a second pilot transistor respectively controlled by said monoflop and by the first of the cascaded Schmitt triggers.

9. In combination, a dyestuff-emitting nozzle provided with an electromagnetically operable discharge-control valve and a pulse generator as defined in claim 1, said load inductance comprising an actuating coil for selectively opening and closing said valve.

10. A pulse generator for the controlled energization of an inductive load, comprising:
    a main supply of direct current;
    a first and a second power transistor connected across said main supply in series with each other and with a load inductance;
    a source of control pulses;
    first and second biasing means normally cutting off said first and second power transistors, respectively;
    first timing means connected to said source and to said first biasing means for unblocking said first power transistor during a first interval upon the occurrence of a control pulse;
    second timing means connected to said source and to said second biasing means for unblocking said second power transistor during a second interval longer than said first interval upon the occurrence of a control pulse, thereby energizing said load inductance to the end of said first interval with a large driving current from said main supply by way of said first and second power transistors;
    an ancillary direct-current supply of lower voltage than said main supply connected across said load inductance by way of said second power transistor for maintaining said load inductance energized to the end of said second interval with a holding current of a magnitude substantially less than that of said driving current; and
    a protective circuit for cutting off said first power transistor upon overlong conduction thereof due to a malfunction of said first timing means, said protective circuit including a low-ohmic resistor in series with said second power transistor and said load inductance.

11. In combination, a dyestuff-emitting nozzle provided with an electromagnetically operable discharge-control valve and a pulse generator as defined in claim 10, said load inductance comprising an actuating coil for selectively opening and closing said valve.

12. A pulse generator for the controlled energization of an inductive load, comprising:
a main supply of direct current;
a first and a second power transistor of opposite conductivity types connected across said main supply in series with each other and with a load inductance, said power transistors being provided with respective collectors connected to opposite ends of said load inductance, said first power transistor having an emitter connected to a high-voltage terminal of said main supply;
a source of contol pulses;
first and second biasing means normally cutting off said first and second power transistors, respectively;
first timing means connected to said source and to said first biasing means for unblocking said first power transistor during a first interval upon the occurrence of a control pulse;
second timing means connected to said source and to said second biasing means for unblocking said second power transistor during a second interval longer than said first interval upon the occurrence of a control pulse, thereby energizing said load inductance to the end of said first interval with a large driving current from said main supply by way of said first and second power transistors;
an ancillary direct-current supply of lower voltage than said main supply connected across said load inductance by way of said second power transistor for maintaining said load inductance energized to the end of said second interval with a holding current of a magnitude substantially less than that of said driving current, said ancillary supply including a low-voltage terminal connected to the collector of said first power transistor by way of a diode; and
a rectifying connection between the collector of said second power transistor and said high-voltage terminal for returning residual energy from said load inductance to said main power supply upon cutoff of said second power transistor.

13. A pulse generator as defined in claim 12, further comprising a protective circuit for cutting off said first power transistor upon overlong conduction thereof due to a malfunction of said first timing means, said protective circuit including a low-ohmic resistor in series with said second power transistor and said load inductance.

14. A pulse generator as defined in claim 12 wherein said first and second timing means comprise a pair of cascaded Schmitt triggers.

15. A pulse generator as defined in claim 14 wherein said first timing means further comprises a monoflop with adjustable time constant connected to the second one of the cascaded Schmitt triggers.

16. A pulse generator as defined in claim 15 wherein said first and second biasing means include a first and a second pilot transistor respectively controlled by said monoflop and by the first of the cascaded Schmitt triggers.

17. In combination, a dyestuff-emitting nozzle provided with an electromagnetically operable discharge-control valve and a pulse generator as defined in claim 12, said load inductance comprising an actual coil for selectively opening and closing said valve.

18. A pulse generator for the controlled energization of an inductive load, comprising:
a main supply of direct current;
a first and a second power transistor connected across said main supply in series with each other and with a load inductance;
a source of control pulses;
first and second biasing means normally cutting off said first and second power transistors, respectively;
first timing means connected to said source and to said first biasing means for unblocking said first power transistor during a first interval upon the occurence of a control pulse;
second timing means connected to said source and to said second biasing means for unblocking said second power transistor during a second interval longer than said first interval upon the occurrence of a control pulse, thereby energizing said load inductance to the end of said first interval with a large driving current from said main supply by way of said first and second power transistors, said first and second timing means including a pair of cascaded Schmitt triggers, said first timing means further including a monoflop with adjustable time constant connected to the second one of the cascaded Schimtt triggers; and
an ancillary direct-current supply of lower voltage than said main supply connected across said load inductance by way of said second power transistor for maintaining said load inductance energized to the end of said second interval with a holding current of a magnitude substantially less than that of said driving current.

19. A pulse generator as defined in claim 18 wherein said first and second biasing means include a first and a second pilot transistor respectively controlled by said monoflop and by the first of the cascaded Schmitt triggers.

20. In combination, a dyestuff-emitting nozzle provided with an electromagnetically operable discharge-control valve and a pulse generator as defined in claim 18, said load inductance comprising an actuating coil for selectively opening and closing said valve.

* * * * *